Inventors
Donald J. Greening
Charles E. Smith
By H R Racher
Attorney

United States Patent Office 3,047,742

Patented July 31, 1962

3,047,742

TRANSISTOR AMPLIFIER SYSTEM FOR AN INDUCTIVE LOAD WITH TRANSISTOR PROTECTION MEANS

Donald J. Greening, Thiensville, and Charles E. Smith, Milwaukee, Wis., assignors to Cutler-Hammer, Inc., Milwaukee, Wis., a corporation of Delaware Filed Aug. 17, 1959, Ser. No. 834,280
2 Claims. (Cl. 307—88.5)

This invention relates to a transistor amplifier system for an inductive load.

The present invention is disclosed, but not claimed in the Greening et al. application, Ser. No. 804,300, filed April 6, 1959.

It is a primary object of the present invention to provide an improved system of the aforementioned type which is characterized by fast response in build-up of the energization of the inductive load for incremental changes in value of the applied signal voltage.

Another object is to provide a system of the aforementioned type which includes means to protect the transistor against high voltages induced in the load when the transistor is biased to a lower output level.

Other objects and advantages of the invention will hereinafter appear.

Figures 1, 2:
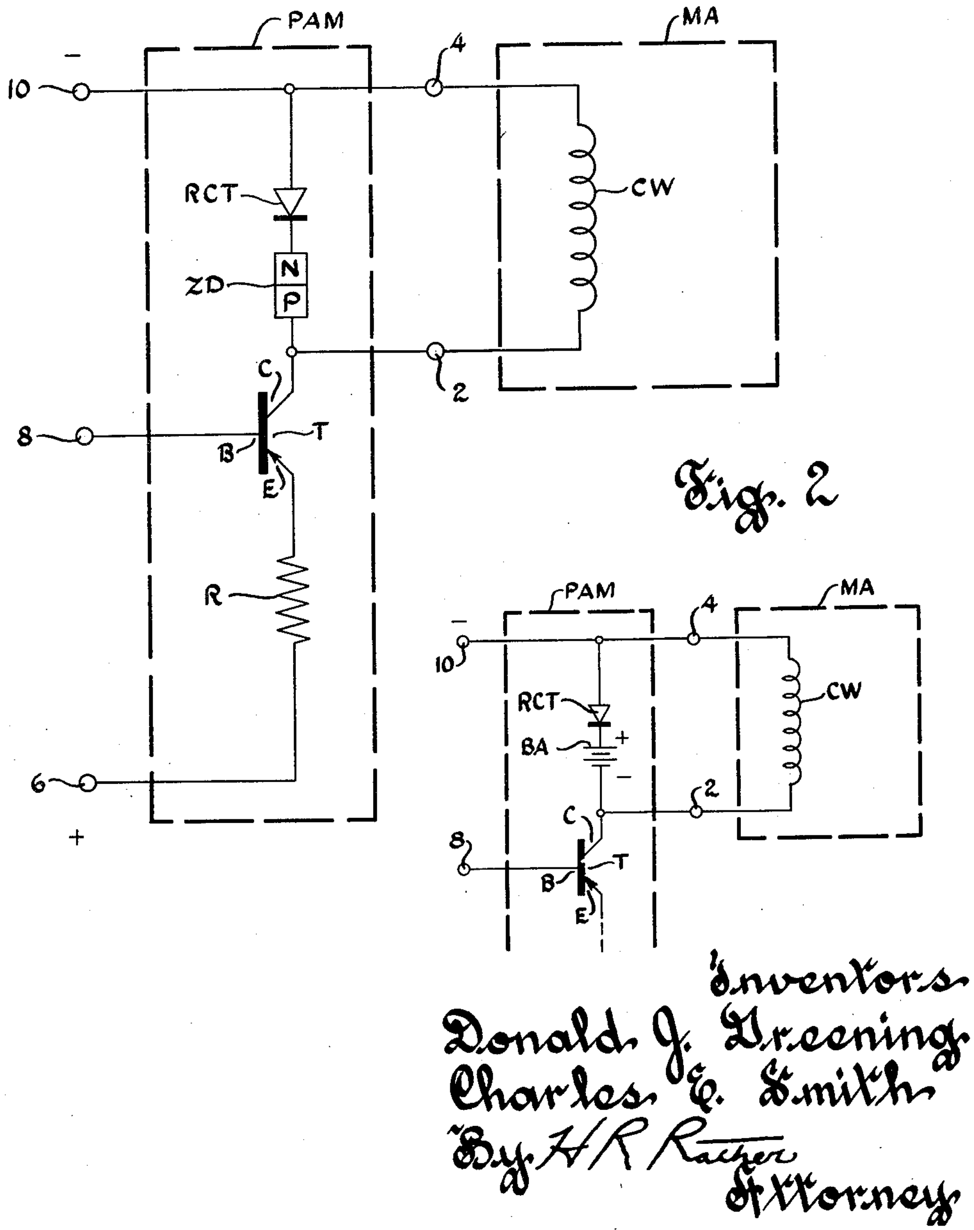
FIGURE 1 is a diagrammatic showing of a circuit including the invention.
FIG. 2 is a modified portion of the circuit of FIG. 1, disclosing another form of the invention.

Referring to the drawings:

In FIGURE 1 the broken line magnetic amplifier MA may be assumed to be a magnetic amplifier which has D.C. control windings CW for input terminals 2 and 4. The broken line rectangle PAM may be assumed to illustrate a power amplifier having output connections to the aforementioned input terminals 2 and 4 of magnetic amplifier MA.

Amplifier PAM is provided with input terminals 6, 8 and 10. Terminal 6 may be assumed to be connected to the positive or high potential terminal of a substantially constant unidirectional voltage source, and terminal 10 may be assumed to be connected to the negative or low potential terminal of the same source. Input terminal 8 may be considered to be connected to a source of voltage which varies somewhere within the limit of the voltage impressed between terminals 6 and 10.

Power amplifier PAM is provided with a semi-conductor amplifying device, such as the transistor T of the P–N–P conductivity type. Transistor T has an emitter electrode E, a base electrode B, and a collector electrode C. Input terminal 8 is connected directly to base electrode B and the collector electrode C is connected directly to the input terminal 2 of magnetic amplifier MA. Input terminal 10 is directly connected to input terminal 4 of amplifier MA. A semi-conductor device, such as a Zener diode ZD of the P–N conductivity type, and a blocking half-wave rectifier RCT are connected in series across the input terminals 2 and 4. The output from the power amplifier PAM is impressed across terminals 2 and 4.

Let it initially be assumed that the potentials at input terminals 6 and 8 are substantially equal. Little or no current will flow through the emitter-collector circuit of the transistor T. However, if the potential supplied to input terminal 8 is progressively decreased with respect to the potential at input terminal 6, there will be a corresponding increase in current flow in the emitter-collector circuit transistor T, from input terminal 6 through resistor R, emitter E, collector C, thence through output terminal 2, control winding CW of amplifier MA to terminal 4 and thence to terminal 10. No current will flow through the shunt path which includes the Zener diode ZD and half-wave rectifier RCT as the rectifier RCT is poled in the direction depicted to block current conduction when current is supplied to the winding CW through the emitter-collector circuit of the transistor T.

With current flow through resistor R, a voltage drop develops thereacross which acts as a negative feedback voltage tending to reduce the emitter-base current flow, and hence tending to regulate the emitter-collector current. However, as the winding CW is inductive it opposes the rise in emitter-collector current flow, and consequently the emitter base current flow is caused to rise to a value causing minimum resistance in the emitter-collector circuit of the transistor. As a result the supply voltage (terminals #6 to #10 minus the drop across resistor R is applied to the load causing a rapid increase in current through winding CW. Thus for a small increase in input signal voltage between terminals 6 and 8, the transistor is virtually biased to a short circuit condition to rapidly build up the energization of winding CW to a value dictated by the incremental change in signal voltage. The aforementioned feedback voltage, of course, acts to prevent over-shooting of the desired level of energization.

Now let it be assumed that control winding CW has been energized and the voltage applied thereacross by action of transistor T is stabilized at some value. Let it further be assumed that the potential difference between input terminals 6 and 8 rapidly decreases thereby tending to bias the transistor T to a minimum current conduction state.

As there will be energy stored in winding CW a sudden shut down in current supplied thereto will tend to effect a very high induced voltage. If rectifier RCT and Zener diode ZD were not connected in shunt across the winding CW, such induced voltage would be added to the collector-emitter circuit of transistor T and might destroy it. However, due to the presence of rectifier RCT, the induced current flow is caused to pass through rectifier RCT bypassing transistor T. Due to the presence of the Zener diode ZD the induced voltage in winding CW will rise in value slightly in excess of the critical voltage of diode ZD, and be constant at such level during a major portion of the period while the stored energy in winding CW is being dissipated. When the induced voltage falls below the critical Zener voltage bypass of current flow is cut off and the remainder could be forced to flow in the collector-emitter circuit of the transistor. However, such remainder is of such a small magnitude as to be well within the $V_{ce}$ of the transistor. The presence of Zener diode ZD, which effectively acts as a battery having a voltage of magnitude equal to its critical or Zener voltage opposing the induced voltage, makes for rapid dissipation of the energy stored in winding CW. Instead of such energy being dissipated in the nominal exponential relation with respect to time, it is accomplished in a considerably steeper exponential relation with respect to time.

It will be apparent that a transistor of the N–P–N conductivity type might also be used, but this would require reversal of the polarities on terminals 6, 8 and 10 and reversal in direction of the poling of rectifier RCT and Zener diode ZD in the circuit depicted.

In the modification of FIG. 2, Zener diode ZD is replaced by the battery BA having an output voltage equal to the critical voltage of Zener diode ZD. The action will be exactly the same as that of the embodiment disclosed in FIG. 1, and this latter embodiment may be desirable where the stored energy to be dissipated from the inductive load exceeds the capabilities of available Zener diodes.

We claim:

1. The combination with a source of constant direct current potential, an inductive load, a source of variable direct current potential, a transistor having its emitter collector circuit connected across said constant potential source in series with said load and having its base connected to said variable potential source, of a Zener diode and a half-wave rectifier connected in series and together in parallel across said load to provide a stored energy dissipation path for said load which bypasses said transistor whenever the induced voltage across said load exceeds the critical voltage of said diode, said rectifier being poled to prevent current flow through it and said diode whenever the applied voltage across said load as determined by the current flow through said transistor exceeds the induced voltage across said load.

2. The combination according to claim 1, together with a resistor connected in series with said load and the emitter collector circuit of said transistor across said load.

References Cited in the file of this patent

UNITED STATES PATENTS

| | | |
|---|---|---|
| 2,896,115 | Guggi | July 21, 1959 |
| 2,909,659 | Woo | Oct. 20, 1959 |
| 2,914,683 | Terry | Nov. 24, 1959 |

UNITED STATES PATENT OFFICE

CERTIFICATE OF CORRECTION

Patent No. 3,047,742

July 31, 1962

Donald J. Greening et al.

It is hereby certified that error appears in the above numbered patent requiring correction and that the said Letters Patent should read as corrected below.

Column 4, line 5, for "load" read -- source --.

Signed and sealed this 27th day of November 1962.

(SEAL)
Attest:

ESTON G. JOHNSON
~~ERNEST W. SWIDER~~
Attesting Officer

DAVID L. LADD
Commissioner of Patents